United States Patent [19]

Davey et al.

[11] 4,188,710

[45] Feb. 19, 1980

[54] OHMIC CONTACTS FOR GROUP III-V N-TYPE SEMICONDUCTORS USING EPITAXIAL GERMANIUM FILMS

[75] Inventors: John E. Davey, Alexandria; Aristos Christou, Springfield, both of Va.

[73] Assignee: The United States of America as represented by the Secretary of the Navy, Washington, D.C.

[21] Appl. No.: 933,017

[22] Filed: Aug. 11, 1978

[51] Int. Cl.² .................... H01L 21/22; H01L 21/225
[52] U.S. Cl. ........................................ 29/580; 29/590; 148/175; 427/85; 427/86; 427/88; 427/91; 156/DIG. 67; 156/662; 156/612; 156/613; 357/16; 357/67; 357/71
[58] Field of Search ............... 427/86, 88, 91; 357/71, 357/67, 16; 156/662; 134/28; 29/590, 580; 148/175

[56] References Cited

U.S. PATENT DOCUMENTS

| 3,577,286 | 5/1971 | Berkenblit | 427/91 |
| 3,716,407 | 2/1973 | Kahn | 427/91 |
| 3,753,804 | 8/1973 | Tijburg | 357/67 |
| 3,846,169 | 11/1974 | Diguet | 427/91 |
| 3,914,785 | 10/1975 | Ketchow | 357/67 |
| 3,923,975 | 12/1975 | Caluiello | 427/91 |
| 4,119,994 | 10/1978 | Jain | 357/16 |
| 4,128,733 | 12/1978 | Fraas | 357/16 |

Primary Examiner—Michael F. Esposito
Attorney, Agent, or Firm—R. S. Sciascia; Philip Schneider

[57] ABSTRACT

A solid-state diffusion method for providing ohmic contacts to n-type Group III-V semiconductor materials, such as gallium arsenide (GaAs). The material is successively cleaned, etched, rinsed, re-etched, rinsed and placed in an oil-free vacuum. The substrate is then heated to desorb surface oxides and an epitaxial layer of germanium and a layer of nickel, or other refractory, are deposited on the substrate at specific temperatures. Next, the structure is annealed in the vacuum at temperatures sufficient to diffuse the germanium into the GaAs material and to establish an ohmic contact.

14 Claims, 2 Drawing Figures

4,188,710

OHMIC CONTACTS FOR GROUP III-V N-TYPE SEMICONDUCTORS USING EPITAXIAL GERMANIUM FILMS

BACKGROUND OF THE INVENTION

This invention relates generally to ohmic contact metallization on n-type Group III-V semiconductors and, more particularly, to contacts formed on semiconductors such as gallium arsenide (GaAs).

The reliability of GaAs devices, such as field effect transistors, mixer and IMPATT diodes, and Gunn devices, is directly related to the integrity of the low-resistance ohmic contacts to the semiconductor surface. Typically, present contacting methods involve depositing a solid solution of gold and germanium or silver and germanium on a GaAs substrate and then applying sufficient heat to melt the metals by annealing through the eutectic temperature and thereby alloy the metal film with the substrate. Such methods which involve melting produce ohmic contacts which are adequate for many purposes. However, major disadvantages of the melting processes are the lack of uniform wetting of the metals to GaAs, microsegregation and microcrystallization of the metals and GaAs, nonuniform germanium doping characteristics in the semiconductor regrown layer, outdiffusion of gallium and arsenic from the GaAs to the top layer of the contact, and germanium surface roughness. These problems adversely affect the reliability, electrical performance, and dimensional control of the contact metallization.

SUMMARY OF THE INVENTION

The present invention includes successively cleaning a substrate, such as gallium arsenide (GaAs), with trichloroethylene, acetone, and deionized water, etching with hydrofluoric acid, rinsing in deionized water, re-etching and rinsing, and placing the substrate in an oil-free vacuum. The substrate is then heated to desorb surface oxides. An epitaxial layer of germanium and a layer of nickel, or other refractory, are individually deposited on the substrate at specific temperatures. The structure is annealed in the vacuum at temperatures high enough to diffuse the germanium and nickel with the substrate material and achieve an ohmic contact.

This solid state diffusion process eliminates the major disadvantages of existing contacting methods because the doping characteristics in the semiconductor regrown layer are controlled by the germanium epitaxial deposition temperature and the anneal temperature, and the germanium film, as an epitaxial layer, inhibits the outdiffusion of gallium and arsenic and completely covers the GaAs surface. Therefore, uniform wetting of the germanium to the GaAs is attained; microsegregation and microcrystallization effects are negated; and the ohmic contact surface is smooth.

Other advantages of the invention will become apparent from the following detailed description of the invention when considered in conjunction with the accompanying drawing wherein:

DESCRIPTION OF THE INVENTION

Figure 1:
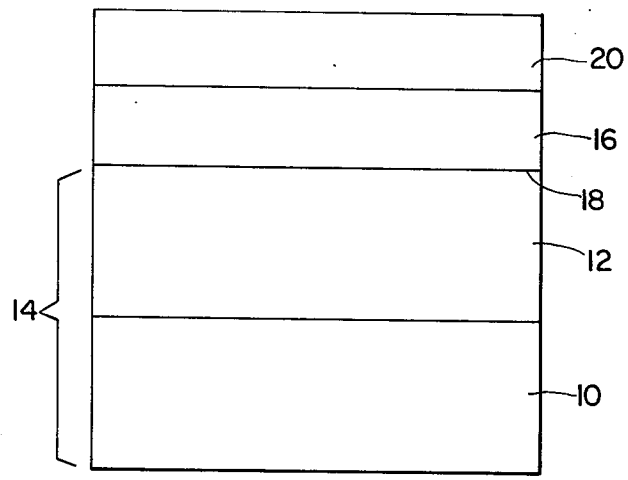
FIGS. 1 and 2 are sectional views of a semiconductor device illustrating the structure before and after the anneal treatment respectively.

Referring now to the drawing, wherein like reference characters designate like or corresponding parts throughout the views, FIG. 1 shows a single-crystal gallium arsenide (GaAs) material 10 prepared in any suitable manner, such as with n+material doped with approximately $2 \times 10^{18}$ tellurium atoms per cubic centimeter for potential use as a microwave diode, or with a semi-insulating form of this material of approximately $1 \times 10^7$ ohm-centimeter resistivity to be used for development of a field effect transistor. A GaAs epitaxial layer 12 suitably below two microns thick and including an n-type dopant of typically $1 \times 10^{17}$ atoms per cubic centimeter is grown on the material 10 to form a substrate 14.

The substrate 14 is successively cleaned in trichloroethylene for thirty seconds, in acetone for thirty seconds, and in deionized water for thirty seconds. The substrate 14 is then etched in diluted hydrofluoric acid (HF), having ten parts water to one part HF, for ten seconds, rinsed in deionized water for thirty seconds, re-etched in a HF-hydrogen peroxide solution for two minutes, and finally rinsed in deionized water for thirty seconds. Subsequently, the treated substrate 14 is placed in an oil-free vacuum system which maintains a vacuum of at least $2 \times 10^{-7}$ Torr during the remaining procedures. The temperature of the substrate 14 is elevated to 575° C. ± 2° C. for about fifteen minutes to desorb the surface oxides.

A germanium epitaxial layer 16 about 1000 Å thick is deposited on the substrate 14 at a substrate temperature of approximately 425° C. which is a sufficient temperature to develop an epitaxial growth. The interface 18 between layers 12 and 16 is shown for a better understanding of the process upon its completion. An overlayer of nickel 20 about 1000Å in thickness is then deposited at a substrate temperature of 110° C. ± 10° C. which is a sufficient temperature to minimize sticking coefficients of residual gases without causing a reaction between the nickel and substrate. Next, the structure is immediately annealed at temperatures within the range of 350° C. to 525° C. for thirty minutes to attain a good ohmic contact resistance which is in the range of $1 \times 10^{-6}$ ohm-cm$^2$ to $1 \times 10^{-5}$ ohm-cm$^2$. The metallized structure cools to room temperature and is removed from the vacuum chamber. Electronbeam evaporation is the preferred technique for depositing layers 16 and 20. Other suitable methods, such as known thin film deposition techniques, may be used, but greater care must be taken to avoid damaging the substrate 14.

Figure 2:
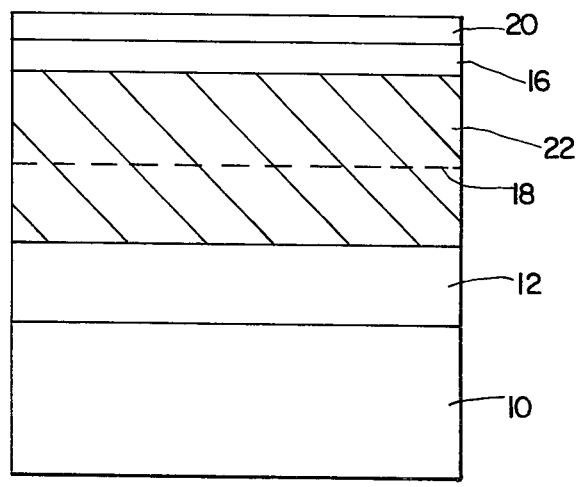

In FIG. 2, the annealed structure shows a new epitaxially grown n+ layer 22 comprising GaAs doped with germanium and some nickel. Immediately above this layer 22 a portion of the germanium layer 16 remains epitaxial but now contains some diffused nickel. The layer of nickel 20 has been reduced to 200Å in thickness and remains as the top surface. The location of the former interface 18 between layers 12 and 16 from FIG. 1 is shown in FIG. 2 to illustrate the positional formation of layer 22 relative to layers 12 and 16.

Since the germanium layer 16 is epitaxial, that is, it has the same crystalline form as the GaAs substrate 14, the germanium completely covers the GaAs substrate surface and uniformly wets the GaAs substrate. The germanium epitaxial layer 16 and the nickel overlay 20 have completely smooth surfaces which provide a totally smooth ohmic contact to GaAs. The single crystal form of the germanium epitaxial layer 16 inhibits the diffusion of gallium and arsenic from the GaAs substrate 14 by way of the grain boundaries and thereby improves the reliability and thermal stability of the ohmic contact. The uniformly grown $n^{30}$ layer 22 of GaAs doped with germanium and nickel provides the ohmic contact with the low-resistivity characteristics which are required for semiconductor devices.

The invention as herein described applies not only to GaAs but also to other III-V n-type semiconductor compounds such as InP and ternary and quarternary alloys such as InGaAsP, with the exception that the substrate temperature for desorbing surface oxides may differ from that required for GaAs. For example, InP must be desorbed at 410° C.

The nickel overlayer may be replaced by a refractory metal film Groups V and VI of the Periodic Table, such as tantalum, tungsten, or molybdenum. However, the temperature range for annealing structures having any of these refractories is 400° C. to 500° C.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method for making an ohmic contact to an n-type III-V semiconductor material, comprising the steps of:
   cleaning the material successively in trichloroethylne, acetone, and deionized water;
   etching said material in diluted hydrofluoric acid;
   rinsing the material in deionized water;
   re-etching said material in a hydrofluoric acid-hydrogen peroxide solution;
   re-rinsing the material in deionized water;
   placing the material in an oil-free vacuum of at least $2 \times 10^{-7}$ Torr and maintaining the material at a temperature of 575° C. ± 2° C. for approximately fifteen minutes for desorbing any surface oxides of the material;
   forming an epitaxial layer of germanium on said material in said vacuum, the material being maintained at a temperature sufficient to develop an epitaxial growth for completely covering and uniformly wetting said material;
   forming an overlayer of a metal selected from the group consisting of nickel and a refractory metal from Groups V and VI of the Periodic Table on said epitaxial layer for developing a semiconductor structure, said material being maintained at a temperature sufficient to minimize sticking coefficients of residual gases without causing a reaction between the overlayer and the material during the forming of the overlayer; and
   annealing said structure at a temperature sufficient for diffusing the overlayer and epitaxial layer with said material and for forming said ohmic contact, said temperature being within the range of 350° C. and 525° C. for nickel and within the range of 400° C. to 500° C. for a refractory metal from Groups V and VI of the Periodic Table.

2. A method as recited in claim 1, wherein said semiconductor material is a gallium arsenide substrate.

3. A method as recited in claim 1, wherein said cleaning includes successively cleaning the material in trichloryethylene for thirty seconds, and in acetone for thirty seconds and in deionized water for thirty seconds.

4. A method as recited in claim 1, wherein said material is etched for ten seconds in diluted hydrofluoric acid, having ten parts water to one part hydrofluoric acid.

5. A method as recited in claim 1, wherein said material is rinsed in deionized water for thirty seconds.

6. A method as recited in claim 1, wherein said material is re-etched in a hydrofluoric acid - hydrogen peroxide solution for two minutes.

7. A method as recited in claim 1, wherein said material is re-rinsed in deionized water for thirty seconds.

8. A method as recited in claim 1, wherein said epitaxial layer of germanium is approximately 1000Å thick and is formed at a semiconductor material temperature of about 425° C.

9. A method as recited in claim 1, wherein said overlayer is a metal selected from the group consisting of nickel, tantalum, tungsten and molybdenum.

10. A method as recited in claim 9, where said overlayer is a metal selected from the group consisting of tantalum, tungsten and molybdenum.

11. A method as recited in claim 9, wherein said overlayer is nickel.

12. A method as recited in claim 11, wherein said overlayer of nickel is approximately 1000Å thick and is formed at a semiconductor material temperature of 110° C. ± 10° C.

13. A method as recited in claim 9, wherein said overlayer is a layer of nickel formed on said epitaxial layer of germanium.

14. A method as recited in claim 13, wherein said epitaxial layer of germanium is about 1000Å in thickness and is formed at a semiconductor material temperature of about 425° C., and said overlayer of nickel is approximately 1000Å thick and is formed at a semiconductor material temperature of 110° C. ± 10° C.

* * * * *